United States Patent
Seki et al.

(10) Patent No.: US 6,715,660 B2
(45) Date of Patent: Apr. 6, 2004

(54) RECOGNITION DEVICE, BONDING DEVICE, AND METHOD OF MANUFACTURING A CIRCUIT DEVICE

(75) Inventors: Kouji Seki, Gunma (JP); Noriyasu Sakai, Gunma (JP); Toshihiko Higashino, Gunma (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/178,506

(22) Filed: Jun. 24, 2002

(65) Prior Publication Data

US 2003/0000995 A1 Jan. 2, 2003

(30) Foreign Application Priority Data

Jun. 27, 2001 (JP) ..................... P.2001-195396

(51) Int. Cl.$^7$ ............................ B23K 31/02; H04N 7/18
(52) U.S. Cl. ............................ 228/8; 348/87
(58) Field of Search ................... 228/103, 105, 228/8, 9; 348/207.99, 208.99, 87, 90

(56) References Cited

U.S. PATENT DOCUMENTS 6,234,376 B1 * 5/2001 Wicen ..................... 228/180.5

FOREIGN PATENT DOCUMENTS

JP          63-29535 A   *  2/1988  .......... H01L/21/60

OTHER PUBLICATIONS

U.S.2003/0019906 A1 Sakai et al. (Jan. 30, 2003—10/201,064 filed Jul. 22, 2002).*

* cited by examiner

*Primary Examiner*—M. Alexandra Elve
*Assistant Examiner*—Kevin P. Kerns
(74) *Attorney, Agent, or Firm*—Fish & Richardson P.C.

(57) ABSTRACT

The present invention solves a problem that in a wire bonding process, an inert gas used for prevention of oxidation of a substrate gave rise to shimmer due to the temperature difference during bonding, thereby degrading the precision of pattern recognition. With this invention's bonding device 21 provided with recognition device, a shimmer prevention blow mechanism 31 is disposed between a ring illumination 25 and a working hole 24 and near working hole 24. Though the nitrogen gas that blows out from working hole 24 gives rise to shimmer due to temperature difference, this shimmer can be blown away by the nitrogen gas blow from shimmer prevention blow mechanism 31. As a result, the recognition precision of a recognition camera can be improved and the wire bonding precision of the μm order can be improved.

14 Claims, 12 Drawing Sheets

RECOGNITION DEVICE, BONDING DEVICE, AND METHOD OF MANUFACTURING A CIRCUIT DEVICE

BACKGROUND OF THE INVENTION

1. Field of the Invention

This invention concerns a recognition device, a bonding device, and a circuit device manufacturing method, and in particular concerns the improvement of the precision of recognition by a recognition device, the improvement of the precision of bonding by a bonding device, and a circuit device manufacturing method that uses such a recognition device and bonding device.

2. Description of the Related Art

Priorly with semiconductor devices, wire bonding to mounting parts formed on a lead frame was performed according to each mounting part, and as an embodiment therefor, a recognition device and bonding device for such wire bonding is disclosed for example in Japanese Unexamined Patent Publication No. Sho-63-29535.

Figure 14:
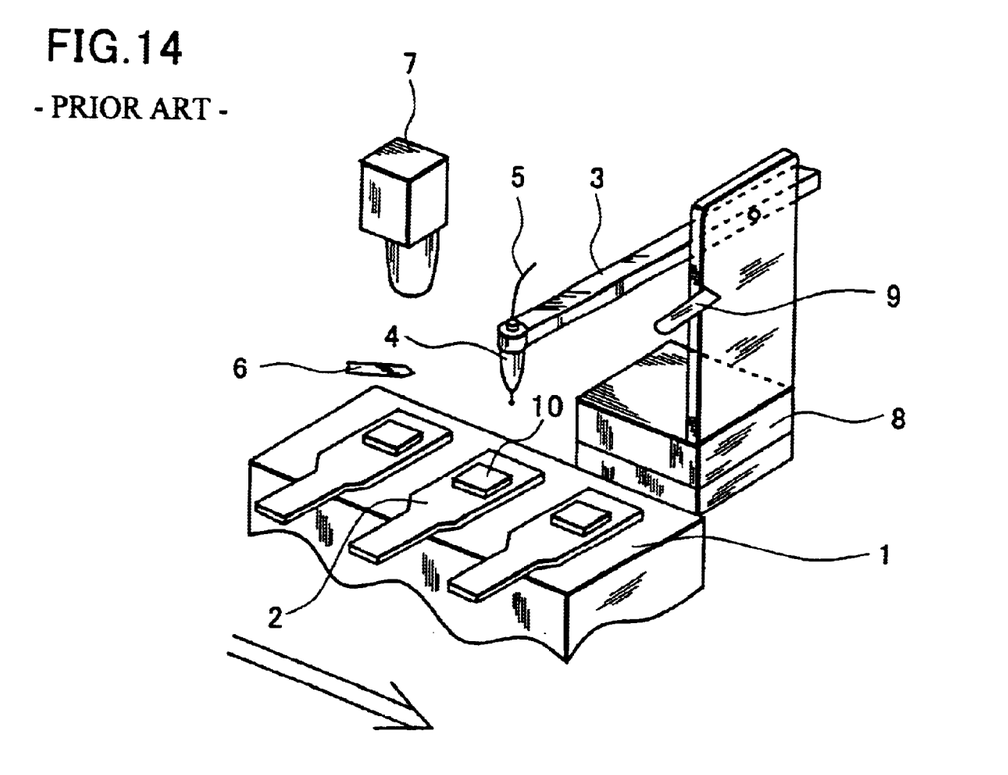
FIG. 14 is a diagram for explaining a bonding device provided with recognition device of the prior art.

As shown in FIG. 14, a transistor lead frame 2, to which a chip 10 is attached, is set on a heating block part 1. A bonding arm 3 is disposed above lead frame 2 on heating block 1 and a capillary 4 is disposed at the tip of bonding arm 3. A wire 5 is disposed in this capillary 4 and a torch 6, for forming a ball from wire 5, is disposed near capillary 4.

This thermocompression type bonding device is provided with a wire bonding position recognition part 7 and a bonding head driving part 8 as well as with a local heating device 9, which is set to operate in linkage with the operation of bonding head driving part 8 in the X and Y directions and is for heating the bonding part locally. A laser beam device may for example be used as this local heating device 9.

The operations shall now be described. Bonding head driving part 8 is made to move, as programmed in advance in accordance with information from wire bonding position recognition part 7, to lead frame 2 that has been heated by heating block 1, local heating device 9 is made to operate just during the bonding process to perform ball bonding while compensating for inadequate heat on chip 10, capillary 4 is thereafter moved to the lead frame 2 side, local heating device 9 is made to operate again just during the bonding process to perform stitch bonding while compensating for inadequate heat at the lead frame 2 side, and then torch 6 is made to form a ball part at the tip of a wire 5 that has been cut.

Ball bonding is then performed on the other electrode of chip 10 while making local heating device 9 operate just during bonding to compensate for inadequate heat at chip 10, capillary 4 is thereafter moved to the lead frame side, local heating device 9 is made to operate again just during the bonding process to perform stitch bonding while compensating for inadequate heat at the lead frame side, and then torch 6 is made to form a ball part at the tip of a wire 5 that has been cut. Since bonding is thus performed while compensating for inadequate heat at the bonding part, a high quality wire bond is obtained. A wire bond of even higher quality can be obtained by using ultrasonic waves in combination.

Also though the case of a transistor chip was described with the above-described embodiment, this invention is not limited thereto and the chip may be a diode, IC, etc., and the invention can thus be applied as a wire bonder for any semiconductor device.

[Object(s) of the Invention]

In the case where mounting parts are formed on a completely punched lead frame 2 as has been described above, just the mounting parts need to be heated, for example, to approximately 250° C. during wire bonding. That is, since the entirety of lead frame 2 is not constantly in a high temperature state and wire bonding could be performed by partial heating, there are no problems of erroneous recognition, degradation of recognition conditions, etc., with the bonding device and recognition device in the above-described example.

Though details shall be given with the description of an embodiment of the present invention, in the case where a cluster block, having a plurality of mounting parts within a small area, is formed on a conductive foil, lead frame, etc., the conductive foil or lead frame, etc., will be kept at a high temperature state until all of the wire bonding processes for a single cluster block has been completed. There was thus the problem that the conductive foil or lead frame, etc., with the cluster block becomes oxidized due to being placed in the abovementioned high temperature state over a long period of time.

The abovementioned oxidation of the lead frame, etc., may be prevented by placing the lead frame in the high temperature state in a space filled with an inert gas, such as nitrogen gas. However, in order to form this space, an inert-gas-filled space must be formed above the working base on which the lead frame is set and furthermore, a working hole for recognition and wire bonding must be formed above this space. In this case, the inert gas becomes heated to a high temperature within the space and, in the process of escaping to the exterior from the working hole, gives rise to a fluctuation (shimmer) due to the temperature difference with room temperature. This fluctuation invades the recognition region and causes erroneous recognition by the recognition camera, thus leading to lack of precision of recognition of highly integrated, fine, conductive patterns.

SUMMARY OF THE INVENTION

This invention has been made in view of the above-described problems of the prior art and provides a recognition device comprising: a substrate setting base, having a heating function; a cover, which covers a working region from above the abovementioned substrate setting base; a working hole, provided in the upper surface of the abovementioned cover; an illumination, disposed above the abovementioned working hole; and a pattern recognition camera, disposed inside a lens barrel provided above the abovementioned illumination; wherein fluctuation of ascending air current, which is due to an inert gas that is blown inside the abovementioned cover being heated by the abovementioned substrate setting base, is made to escape in the horizontal direction with respect to the abovementioned cover surface by a blow current provided below the abovementioned illumination.

Preferably with the recognition device of this invention, the abovementioned inert gas is made to flow into a space formed by the abovementioned cover and the abovementioned substrate setting base.

Also preferably with the recognition device of this invention, the abovementioned fluctuation is substantially that of the abovementioned inert gas that has been heated.

Also preferably with the recognition device of this invention, the abovementioned inert gas is made of nitrogen gas.

Also preferably with the recognition device of this invention, the abovementioned illumination is a ring-shaped illumination provided below the abovementioned lens barrel part.

Also in order to resolve the above-described problems, this invention provides a bonding device comprising: a substrate setting base, having a heating function; a cover, which covers a working region from above the abovementioned substrate setting base; a working hole, provided in the upper surface of the abovementioned cover; an illumination, disposed above the abovementioned working hole; a capillary, disposed at the side face of the abovementioned illumination; and a pattern recognition camera, disposed inside a lens barrel provided above the abovementioned illumination; wherein fluctuation of ascending air current, which is due to an inert gas that is blown inside the abovementioned cover being heated by the abovementioned substrate setting base, is made to escape in the horizontal direction with respect to the abovementioned cover surface by a blow current provided below the abovementioned illumination, and after recognition by the abovementioned pattern recognition camera, the abovementioned capillary is moved to above the abovementioned working hole and bonding is performed via the abovementioned working hole.

Preferably with the bonding device of this invention, the abovementioned inert gas is made to flow into a space formed by the abovementioned cover and the abovementioned substrate setting base.

Also preferably with the bonding device of this invention, a part of the abovementioned cover is formed of a clamper.

Also preferably with the bonding device of this invention, the abovementioned damper is provided with a blow-in hole for the abovementioned inert gas.

Also preferably with the bonding device of this invention, the abovementioned fluctuation is substantially that of the abovementioned inert gas that has been heated.

Also preferably with the bonding device of this invention, the abovementioned inert gas is made of nitrogen gas.

Also preferably with the bonding device of this invention, the abovementioned illumination is a ring-shaped illumination provided below the abovementioned lens barrel part.

Also in order to resolve the above-described problems, this invention provides a circuit device manufacturing method comprising the steps of: preparing a block substrate, which is provided with a plurality of mounting parts and conductive patterns, wherein leads are integrated within a small area, and with which circuit elements are affixed respectively onto the abovementioned mounting parts; setting the abovementioned block substrate on a substrate setting base until assembly onto all of the abovementioned mounting parts is completed; heating the abovementioned substrate setting base by a heating function while filling the interior of a cover with an inert gas; and making the fluctuation of ascending air current, which is due to an inert gas that is blown inside the abovementioned cover being heated by the abovementioned substrate setting base, escape in the horizontal direction with respect to the abovementioned cover surface by a blow current provided below the abovementioned illumination, recognizing the abovementioned circuit elements respectively on the abovementioned mounting parts by means of a recognition camera installed inside a lens barrel, and wire bonding the abovementioned circuit elements, respectively on the abovementioned mounting parts, to the abovementioned conductive patterns.

Preferably with the circuit device manufacturing method of this invention, a part of the abovementioned cover is formed of a clamper.

Also preferably with the circuit device manufacturing method of this invention, inert gas is blown inside the abovementioned cover via the abovementioned clamper.

Also preferably with the circuit device manufacturing method of this invention, the abovementioned fluctuation is substantially that of the abovementioned inert gas.

Also preferably with the circuit device manufacturing method of this invention, the abovementioned inert gas is made of nitrogen gas.

Also preferably with the circuit device manufacturing method of this invention, each of the abovementioned circuit elements has one or both of a bare semiconductor chip and a chip circuit part affixed thereto.

This invention's recognition device comprising: a substrate setting base, having a heating function; a cover, which covers a working region from above the abovementioned substrate setting base; a working hole, provided in the upper surface of the abovementioned cover; an illumination, disposed above the abovementioned working hole; and a pattern recognition camera, disposed inside a lens barrel provided above the abovementioned illumination. When an inert gas, which is fed inside the abovementioned cover, is heated by the abovementioned substrate setting base and blows out to the exterior from the abovementioned working hole, fluctuation arises due to the temperature difference and this fluctuation stagnates within and in the surroundings of the abovementioned illumination. However, this invention's recognition device is provided with a shimmer prevention device, which is disposed between the lower part of the abovementioned illumination and the abovementioned working hole and near the abovementioned working hole, and the abovementioned fluctuation is made to escape in the horizontal direction with respect to the abovementioned cover surface by a blow current from the abovementioned shimmer prevention blow mechanism, thereby enabling the recognition precision of the abovementioned pattern recognition camera to be improved.

Also, this invention's bonding device comprising: a substrate setting base, having a heater function; a cover, which covers a working region from above the abovementioned substrate setting base; a working hole, provided in the upper surface of the abovementioned cover; an illumination, disposed above the abovementioned working hole; a capillary, disposed at the side face of the abovementioned illumination; and a pattern recognition camera, disposed inside a lens barrel provided above the abovementioned illumination. When an inert gas, which is fed inside the abovementioned cover, is heated by the abovementioned substrate setting base and blows out to the exterior from the abovementioned working hole, fluctuation arises due to the temperature difference. This fluctuation is made to escape in the horizontal direction with respect to the abovementioned cover surface by a blow current provided below the abovementioned illumination, and recognition is performed by means of the abovementioned pattern recognition camera. Thereafter, the abovementioned capillary is moved to above the abovementioned working hole and bonding is performed via the abovementioned working hole. By preventing the entry of the abovementioned fluctuation into the inner side of the abovementioned illumination by means of the abovementioned blow current in this process, the abovementioned pattern recognition by the recognition device can be performed at high precision. A bonding device, which can perform highly precise bonding of the $\mu$m order, can thus be realized.

Also with this invention's circuit device manufacturing method, by use of the above-described recognition device and bonding device, since a substrate, comprising a conductive member on which is formed a cluster block wherein a plurality of mounting parts are integrated in a small area, will not become oxidized even if placed under a high temperature over a long period of time in the wire bonding process, a circuit device manufacturing method can be realized by which the anti-moisture property and anti-peeling property at the surfaces of bonding of the substrate and an insulating resin are improved.

DETAILED DESCRIPTION OF THE PREFERRED EMBODIMENTS

A recognition device, bonding device, and circuit device manufacturing method of this invention shall now be described in detail.

First, a recognition device and bonding device of this invention shall be described with reference to FIGS. 1 through 3.

With an embodiment of this invention, the recognition device and bonding device act together and are arranged as a bonding device 21 provided with a single recognition device.

Figure 1:
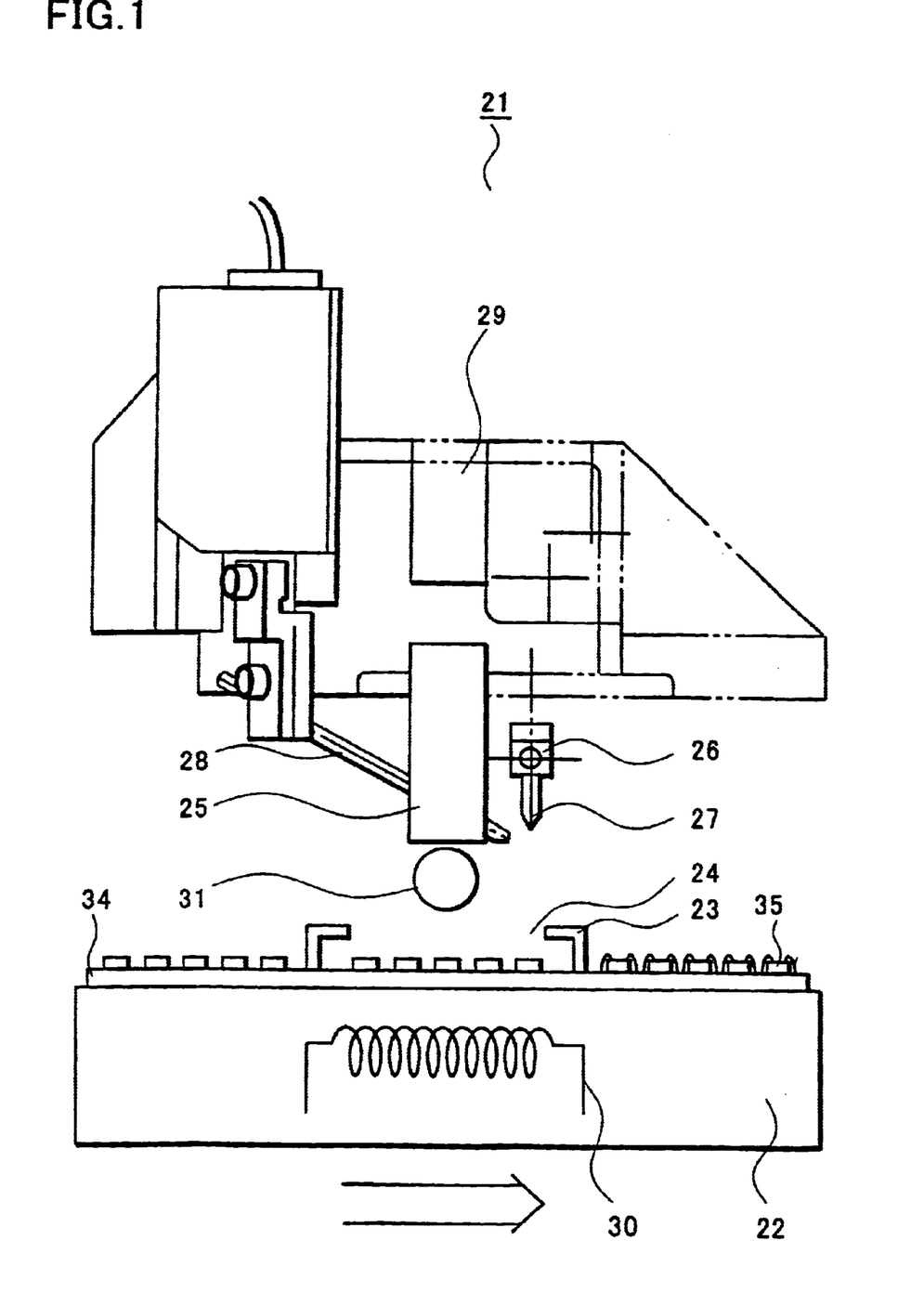
FIG. 1 is a diagram for explaining bonding device provided with recognition device according to the invention.

As shown in FIG. 1, the main structure of bonding device 21 comprises a setting base 22, a cover 23, which covers a working space from above setting base 22, a working hole 24, which is provided in the upper surface of cover 23, a ring illumination 25, which is disposed above working hole 24, a bonding arm 26, which is disposed at the side face of ring illumination 25, a capillary 27, which is disposed at the tip part of bonding arm 26, a torch 28, which is provided near capillary 27, a lens barrel 29, which is disposed above ring illumination 25, a recognition camera, which, though not illustrated, is installed inside lens barrel 29, and a shimmer prevention blowing mechanism 31, which characterizes this invention.

The characteristics of the individual structures shall now be described along with their operations.

First, on setting base 22 is set a lead frame 34, which has a plurality of mounting parts, and setting base 22 is provided with a heater 30 function for heating lead frame 34 and thereby improving the wire bonding property. By means of this heater 30, the interior of a working space arranged by setting base 22 and cover 23, can be kept at a high temperature state of, for example, approximately 230° C. during the wire bonding process.

Also, though not shown in FIG. 1, a part of cover 23 is formed of a damper 60 (see FIG. 9), and this cover 23 is arranged by putting a lid on the upper face of damper 60 for example by means of a stainless steel plate 67 (see FIG. 9). And, for example, nitrogen gas is blown as an inert gas at a rate of 4 liters/minute into cover 23 from damper 60. This blow-in rate can be varied according to the working application. Working hole 24 is provided in the upper surface of cover 23. Working hole 24 is formed to a size, for example, of 5 mm×32 mm and pattern recognition and wire bonding are performed via this working hole 24 in the wire bonding process.

Ring illumination 25 and lens barrel 29 shall now be described. Lens barrel 29 is disposed above ring illumination 25. Lead frame 34 and semiconductor elements 35, which are illuminated by ring illumination 25 via working hole 24, can be recognized by differences in reflectivity. By recognizing this reflected light by means of the recognition camera disposed inside lens barrel 29, pattern recognition of the upper side of lead frame 34 can be performed. Here, by using ring illumination 25 as the illumination, lead frame 34 and semiconductor elements 35 can be illuminated without bias and without giving rise to shadows, thereby enabling pattern recognition to be performed more precisely. Also, though not illustrated, lens barrel 29 is bent in the middle at an angle of 90 degrees with respect to the surface of setting base 22 and the recognition camera is installed beyond this bent part. A mirror is installed an angle of 45 degrees with respect to the setting base 22 surface at this bent part, and pattern recognition can be performed by this structure.

Here, on lead frame 34, for example, 10 rows and 5 columns of mounting parts make up a single cluster block, and a plurality of such cluster blocks are formed. The size of working hole 24 is such that enables, for example, 20 mounting parts of 2 rows of a single cluster block to be recognized from above. As shall be described later, this working hole 24 is used for pattern recognition, etc. The size of this working hole 24 is not defined in particular but is determined according to the working application and based on the recognition pattern method, etc., of bonding device 21.

Bonding arm 26, capillary 27, and torch 28 shall now be described. As shown in FIG. 2, after pattern recognition, ring illumination 25, bonding arm 26, and capillary 27 move and capillary 27 is positioned above working hole 24. Wire bonding is then performed based on the data obtained by the recognition camera, and capillary 27 enters into cover 23 from working hole 24 to perform wire bonding of the electrode pads of semiconductor elements to the desired electrode patterns. In this process, torch 28 performs stitch bonding and forms a ball at the tip of a thin metal wire that has been cut.

Figure 2:
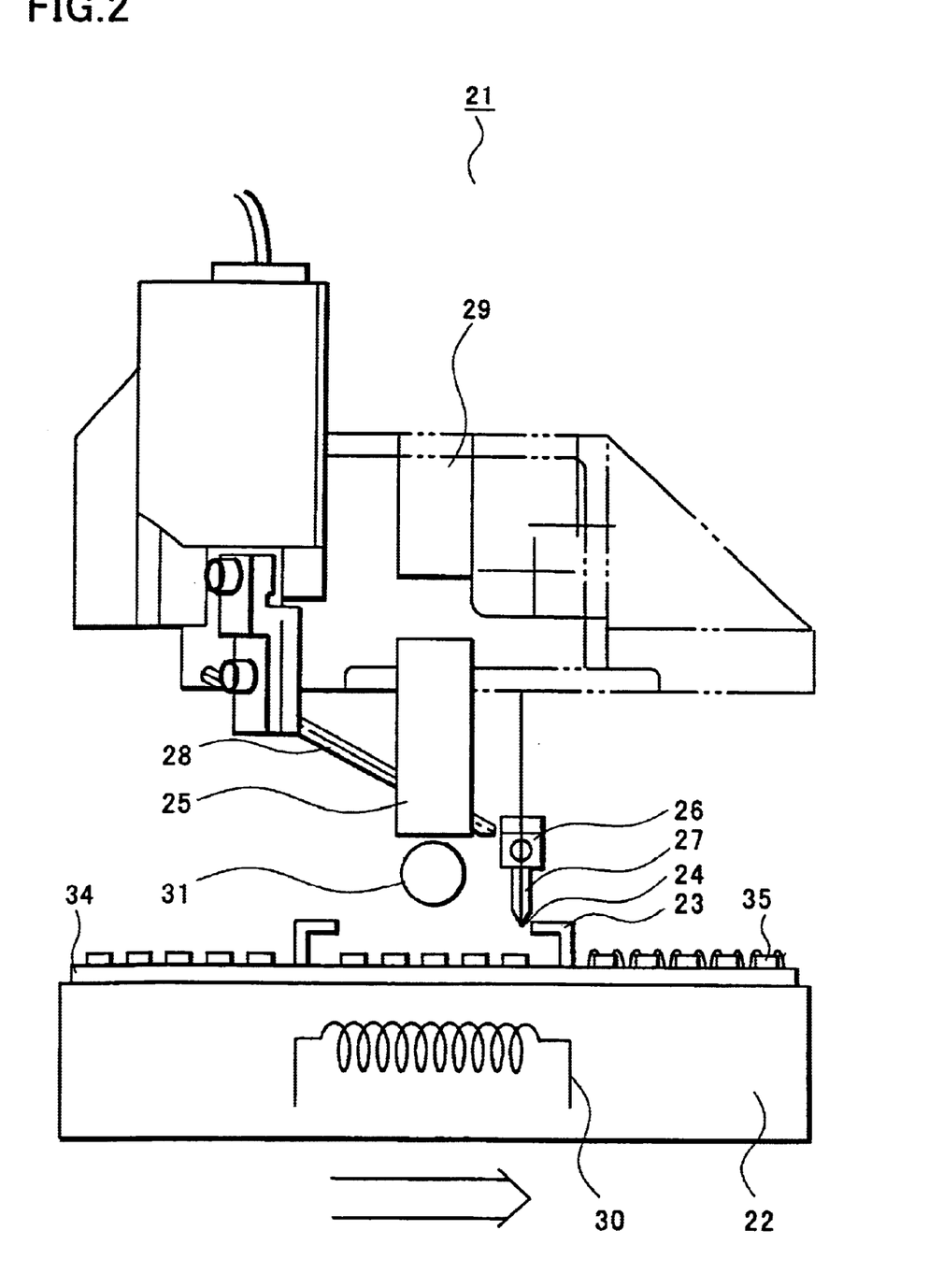
FIG. 2 is a diagram for explaining bonding device provided with recognition device according to the invention.
Figure 3:
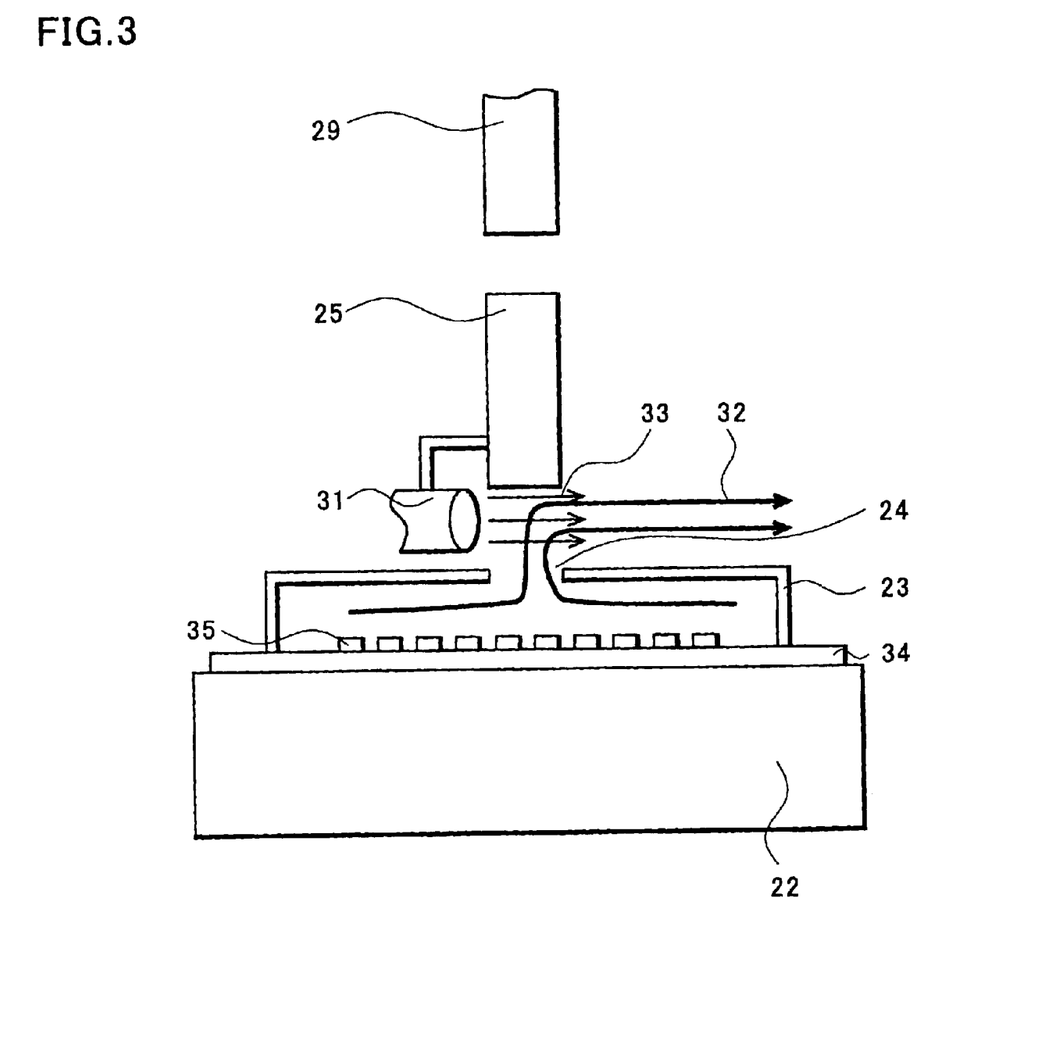
FIG. 3 is a diagram, which shows bonding device provided with recognition device according to the invention in a simplified manner for explanation.

Lastly, the blow device, which characterizes this invention shall be described using FIG. 3. FIG. 3 is, a schematic view of bonding device 21, which is provided with a recognition device as shown in FIGS. 1 and 2.

As shown in FIGS. 1 through 3, shimmer prevention blow mechanism 31 is disposed between ring illumination 25 and cover 23 and near working hole 24. And from shimmer prevention blow mechanism 31, for example, a nitrogen gas blow 33 of 3 liters/minute is blown over working hole 24 in the horizontal direction with respect to the surface of cover 23. Meanwhile, as has been mentioned above, for example, nitrogen gas is blown at a rate of 4 liters/minute into cover 23. At the same time, the interior of cover 23 is kept at a temperature for example of 230° C. by heater 30 built into setting base 22. Though the temperature of the nitrogen gas that is fed in thereafter is, for example, 70° C., it is heated to 230° C. by the heat from heater 30.

Though the heated nitrogen gas flows out to the exterior from working hole 24, since the room temperature at this time is, for example, 20° C., shimmer 32, which is substantially that of the nitrogen gas, is caused by the temperature difference between the nitrogen gas and room temperature. As a result, shimmer 32 stays below ring illumination 25 and at the inner side of ring illumination 25, causing the recognition precision of the recognition camera to degrade and the wire bonding precision to fall.

However, as shown in FIG. 3, the shimmer prevention blow mechanism 31 of this invention is disposed immediately to the side of the lower end of ring illumination 25 and moves along with ring illumination 25. Shimmer prevention blow mechanism 31 can blow away shimmer 32 from above working hole 24 and the surroundings of illumination ring 25 by means of blow 33 of, for example, nitrogen gas of 3 liters/minute. Here, since shimmer prevention blow mechanism 31 is disposed immediately to the side of the lower end of ring illumination 25 as has been mentioned above, the air and especially the oxygen in the working room will not become mixed into nitrogen gas 33. Thus although the nitrogen gas 33 from shimmer prevention blow mechanism 31 may enter inside cover 23 from working hole 24, the oxidation of lead frame 34 will not be promoted.

The shimmer 32 that would stay below ring illumination 25, at the inner side of ring illumination 25, and inside lens barrel 29 can thus be eliminated in advance by shimmer prevention blow mechanism 31. Thus with this invention's bonding device 21 provided with recognition device, even if a lead frame is set on the setting base for a long time, nitrogen gas can be filled during the wire bonding process to prevent oxidation in cover 23. Since the surface of lead frame 34 will therefore not become oxidized, the reflectivity will be good in the process of pattern recognition and the recognition precision can be improved.

Furthermore, though when the lead frame 34 surface becomes oxidized, an antioxidant film that can accommodate for temperatures up to 150° C., for example, can become peeled and make the adhesiveness with resin poor, this problem can also be resolved. The bonding device will thus be one by which anti-moisture property and anti-peeling property can also be improved.

Furthermore, the shimmer 32, which is caused by the temperature difference with room temperature when the nitrogen gas that has been heated inside the cover 23 flows to the exterior via working hole 24, can be eliminated by the shimmer prevention blow mechanism 31 that is disposed at the above-described position. Shimmer 32 will thus not enter into the inner side of ring illumination 25, enabling pattern recognition to be carried out at a high precision of the μm order by the recognition camera and wire bonding to be carried out at high precision as well.

Though wire bonding was described in detail with the present embodiment, equivalent effects can also be provided in die bonding, etc., using an optical recognition device. Also, the object set on the setting base is not limited to a lead frame, and equivalent effects can be obtained for any object with which the oxidation of conductive foil, etc., which shall be described below, needs to be prevented. Applications to devices that are provided with optical recognition devices and are used for the die bonding, wire bonding, or partial coating of soldered parts of metal substrates, printed substrates, ceramic substrates, etc., are also possible.

Also, though the case where a blow 33 of, for example, nitrogen gas of 3 liters/minute is blown out from shimmer prevention blow mechanism 31 was described, the amount of blow 33 is preferably set, in consideration of costs, to the minimum necessary rate by which shimmer 32 can be blown away. The amount of blow 33 shall thus be adjustable appropriately in accordance with the working conditions.

The circuit device manufacturing method of this invention shall now be described with reference to FIGS. 4 to 13.

Figure 4A:
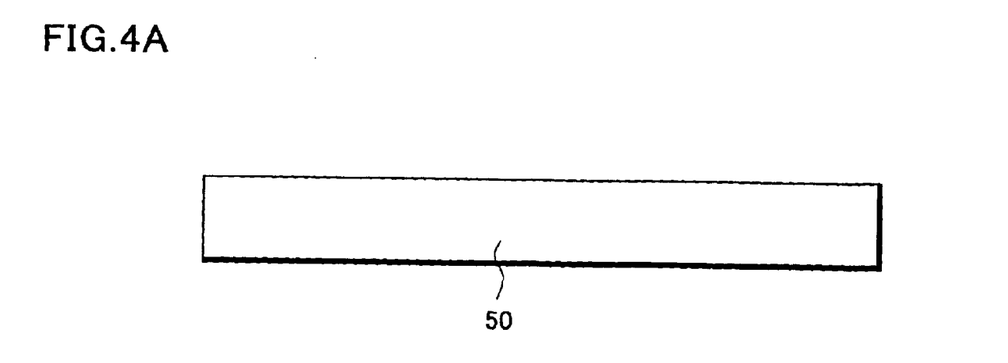
FIG. 4 is a diagram for explaining circuit device manufacturing method according to the invention.
Figure 4B:
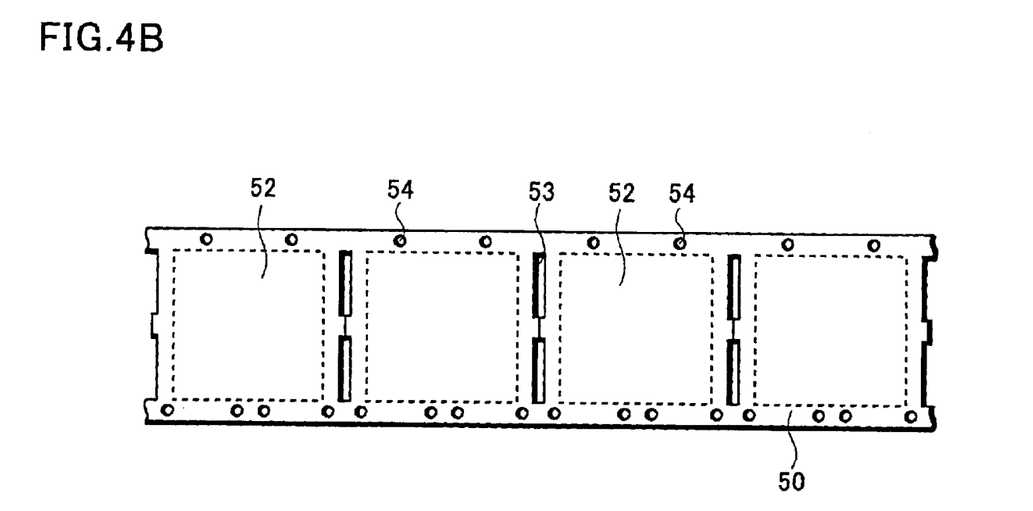
Figure 5:
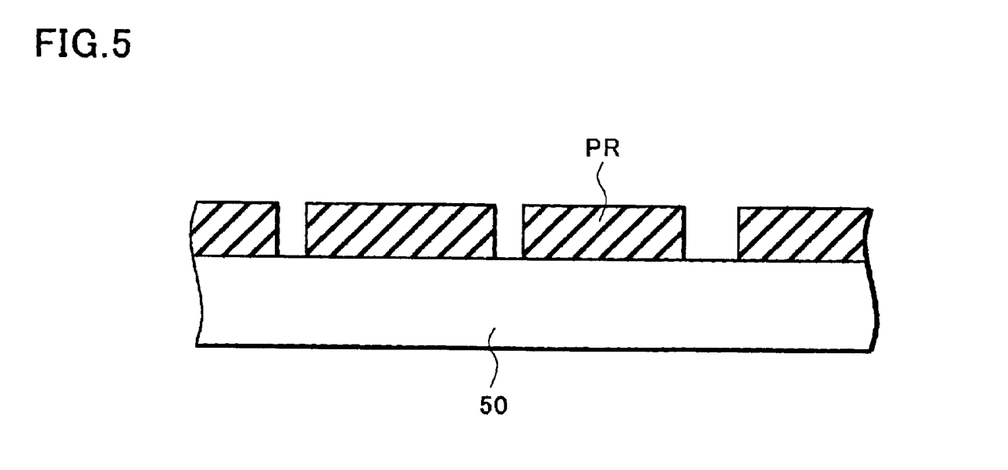
FIG. 5 is a diagram for explaining circuit device manufacturing method according to the invention.

First, as shown in FIGS. 4 to 6, in the first step of this invention, a conductive foil 50 is prepared and conductive patterns 41, which comprise at least a plurality of mounting parts for circuit elements 42, are formed by forming isolation trenches 51, each of which is shallower than the thickness of conductive foil 50, by etching conductive foil 50 in regions besides regions of conductive patterns 41.

In this process, first, as shown in FIG. 4(A), a sheet-form conductive foil 50 is prepared. The material of this conductive foil 50 is selected in consideration of the attachment of the soldering material, bonding properties, and plating properties, and in terms of material, a conductive foil having Cu as the main material, a conductive foil having Al as the main material, or a conductive foil comprising an alloy, such as Fe—Ni, etc., is employed.

In consideration of subsequent etching, the thickness of the conductive foil is preferably approximately 10 μm to 300 μm, and with the present embodiment a 70 μm (2 ounce) copper foil was employed. However basically, a foil with a thickness of 300 μm or more or 10 μm or less may also be used. As shall be described later, it is sufficient that isolation trenches 51, which are shallower than the thickness of conductive foil 50, can be formed.

The sheet-form conductive foil 50 that is prepared may be wound in the form of a roll of a predetermined width, for example, 45 mm and this may be conveyed to the respective processes to be described below, or strip-form conductive foils 50, which have been cut to predetermined sizes, may be prepared and conveyed to the respective processes to be described below.

To be more specific, as shown in FIG. 4(B), a plurality (4 to 5 in the present case) of blocks 52, on each of which a plurality of mounting parts are to be formed, are aligned in a separated manner along a strip-form conductive foil 50. Slits 53 are provided between the respective blocks 52 for absorption of the stress placed on conductive foil 50 as a result of heat treatment in the molding process, etc. Furthermore, index holes 54 are provided at fixed intervals at both sides of conductive foil 50 for the purpose of positioning in the respective processes.

Subsequently, conductive patterns are formed.

A photoresist (anti-etching mask) PR is formed on Cu foil 50 as shown in FIG. 5 and photoresist PR is patterned so that conductive foil 50 will be exposed at regions besides regions that are to become conductive patterns 41. Conductive foil 50 is then etched selectively via photoresist PR as shown in FIG. 6(A).

Figure 6A:
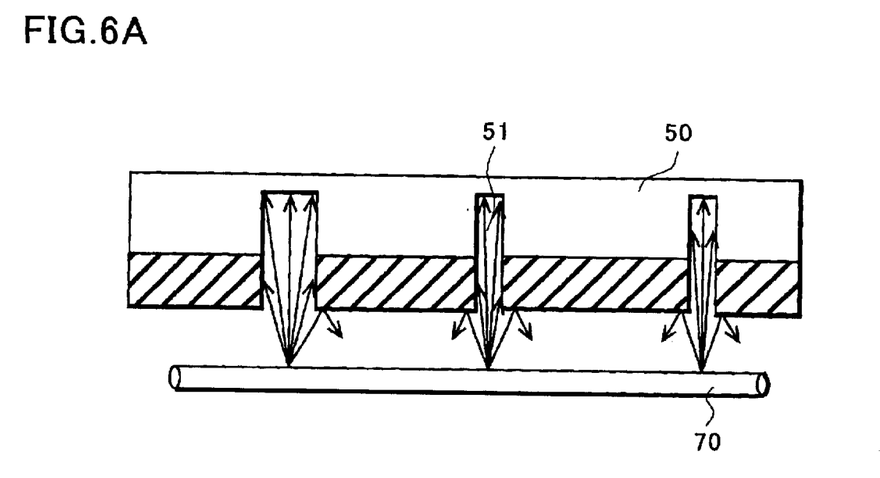
FIG. 6 is a diagram for explaining circuit device manufacturing method according to the invention.

In this process, in order to etch and thereby form isolation trenches 51 uniformly and at high precision in terms of depth, the open parts of isolation trenches 51 are faced downwards and etching solution is showered upwards from etching solution supply pipe 70 disposed below conductive foil 50 as shown in FIG. 6(A). As a result, since the portions of isolation trenches 51 that come in contact with the etching solution become etched and the etching solution is discharged immediately without staying inside the isolation trenches 51, the depth of isolation trenches 51 can be controlled by the duration of etching treatment and isolation trenches 51 that are uniform and high in precision can be formed. Ferric chloride or cupric chloride is mainly employed in the etching solution.

Figure 6B:
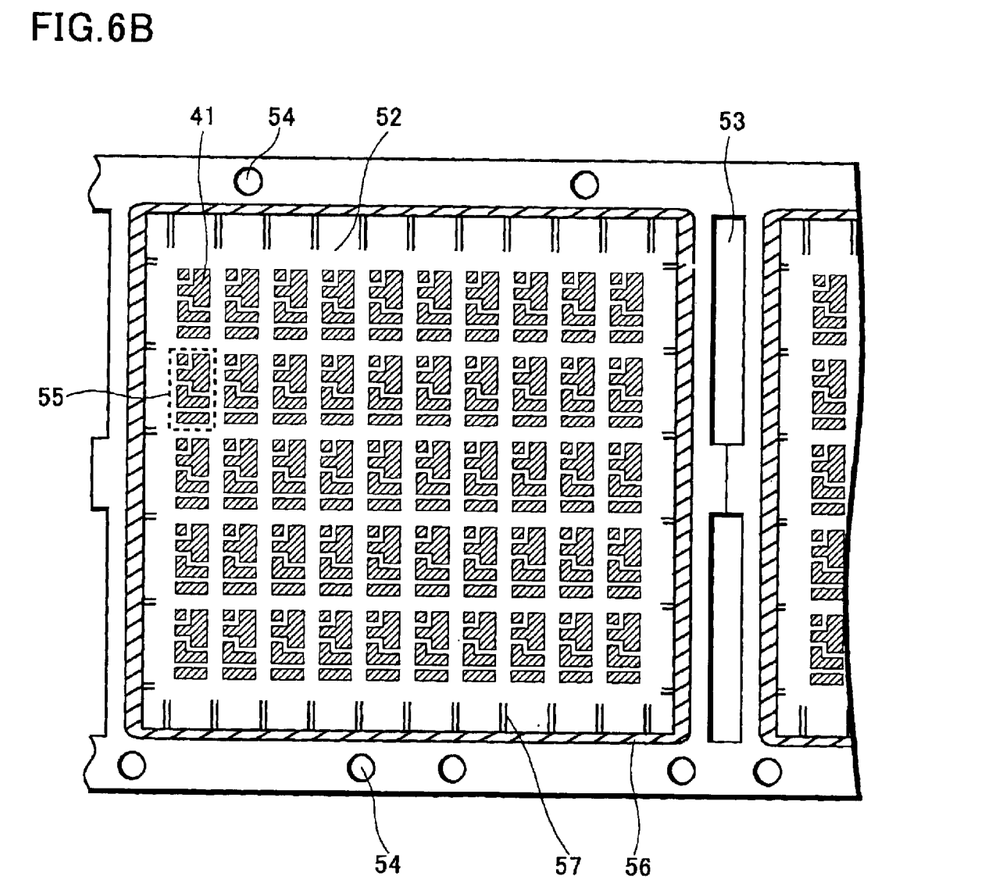

FIG. 6(B) shows specific conductive patterns 41. This Figure corresponds to being an enlarged view of one of the blocks 52 shown in FIG. 4(B). The part indicated by the dotted lines is a single mounting part 55 that makes up conductive patterns 41, a plurality of mounting parts 55 are aligned in matrix form in 5 rows and 10 columns in a single block 52, and the same conductive patterns 41 are provided in each mounting part 55. A frame-like pattern 56 is provided at the periphery of each block and positioning marks 57 for the dicing process are provided slightly separated from and to the inner side of frame-like pattern 56. The frame-like pattern 56 is used for fitting with a molding die and after etching of the rear face of conductive foil 50, serves the function of reinforcing an insulating resin 40.

Figure 7A:
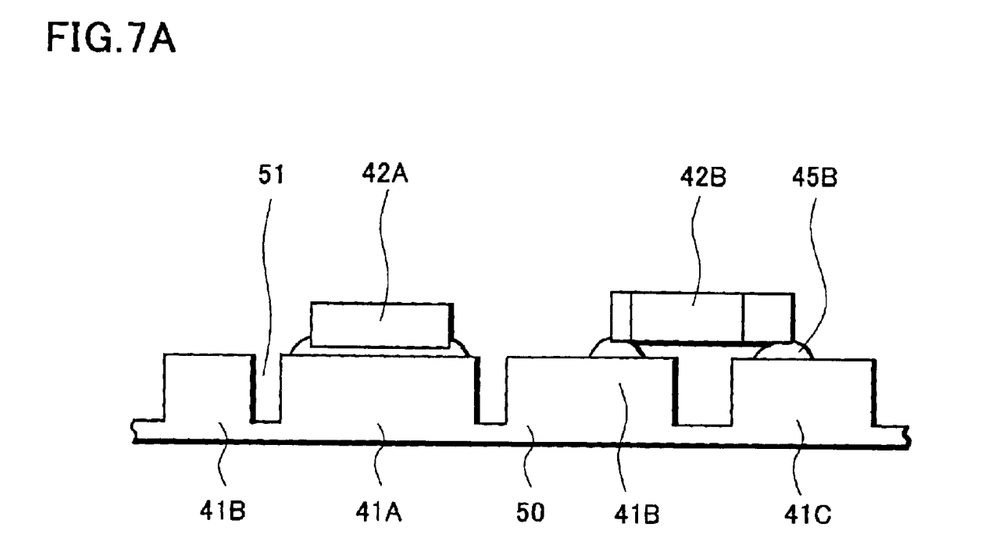
FIG. 7 is a diagram for explaining circuit device manufacturing method according to the invention.
Figure 7B:
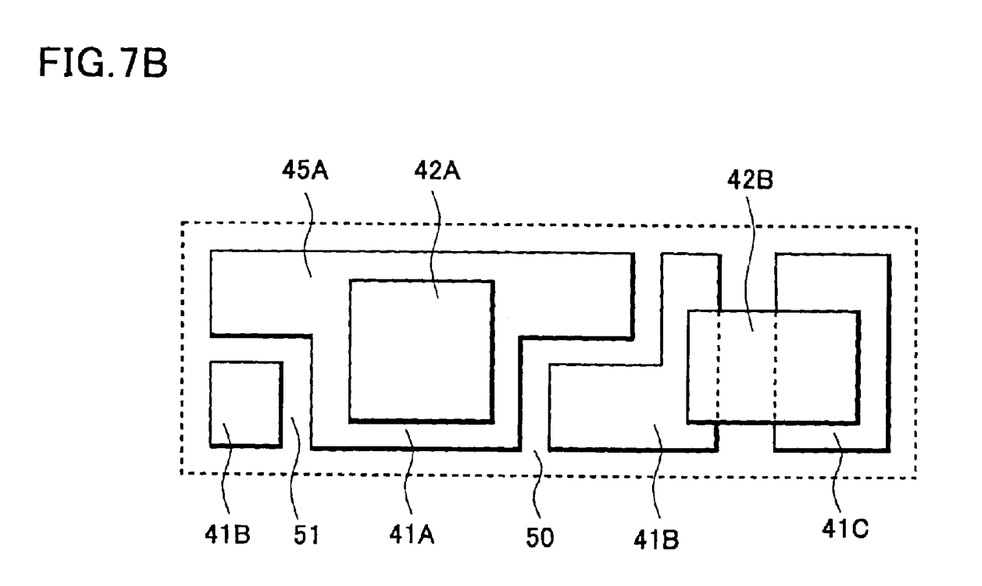

Next in the second step of this invention, circuit elements 42 are affixed to the respective mounting parts 55 with the desired conductive patterns 41 as shown in FIG. 7.

Examples of circuit elements 42 include transistors, diodes, IC chips and other semiconductor elements and chip capacitors, chip resistors, and other passive elements.

Here, a bare transistor chip 42A is die bonded to a conductive pattern 41A and a chip capacitor or passive element 42B is affixed by solder or other soldering material or conductive paste 45B.

Figure 8A:
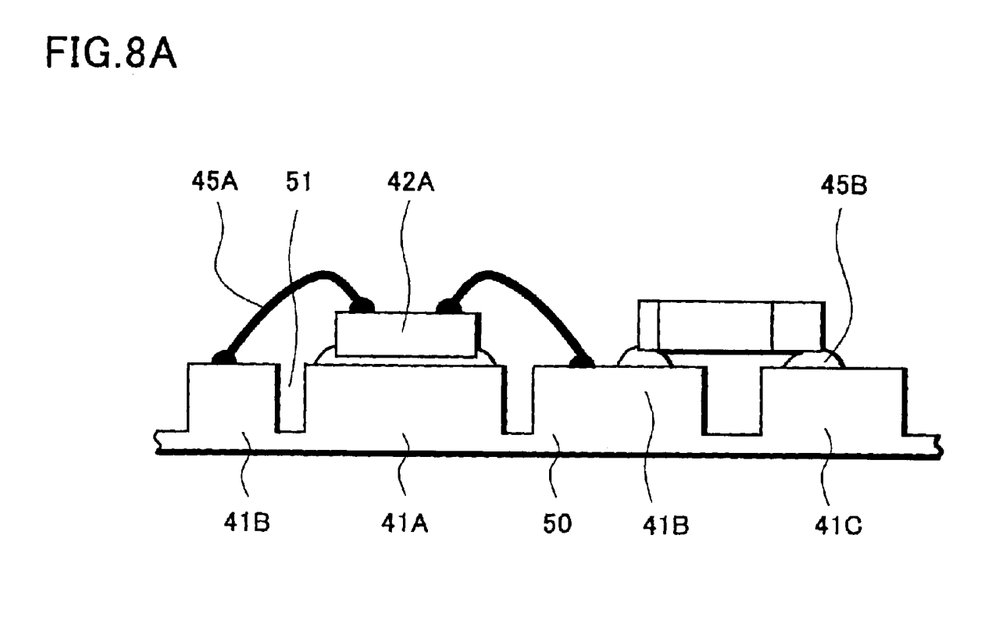
FIG. 8 is a diagram for explaining circuit device manufacturing method according to the invention.
Figure 8B:
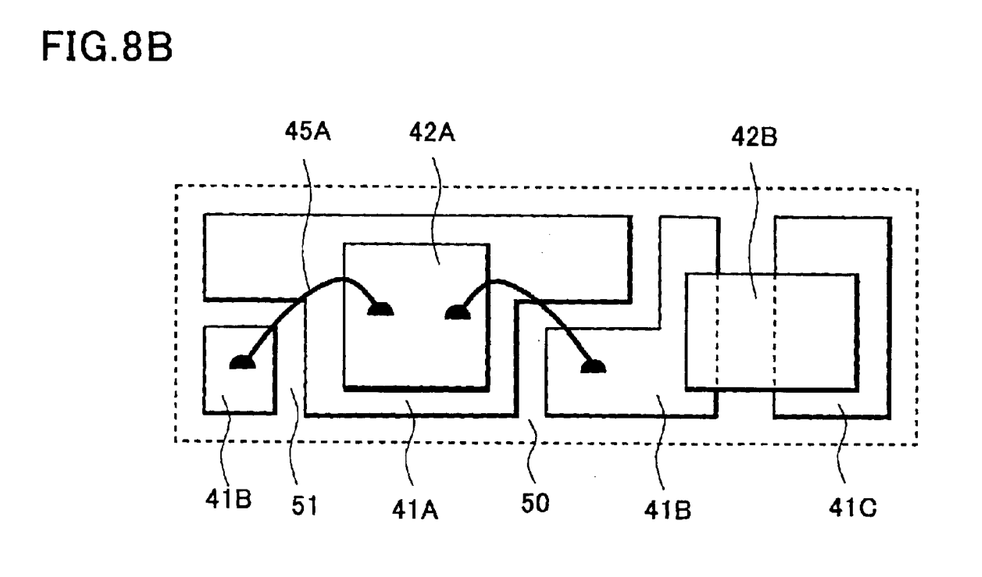

Next, in the third step, which characterizes this invention's circuit device, electrodes of circuit elements 42 of the respective mounting parts 55 are wire bonded to the desired conductive patterns 41 as shown in FIGS. 8 and 9.

Figure 9A:
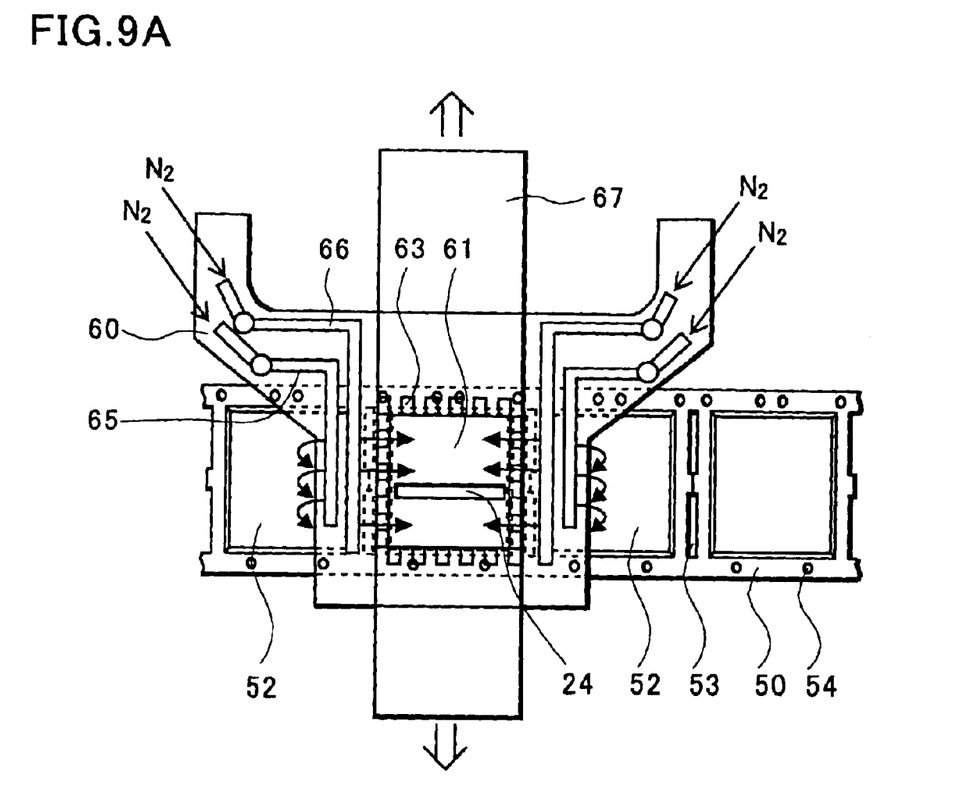
FIG. 9 is a diagram for explaining circuit device manufacturing method according to the invention.

In this step, wire bonding is performed using the bonding device 21 provided with recognition device that was shown in FIG. 1. As shown in FIG. 9(A), damper 60 is disposed above setting base 22 of bonding device 21 and the peripheral edges of block 52 of conductive foil 50 are pressed by means of damper 60 to bring conductive foil 50 into close contact with a heating block 64 on the surface of setting base 22.

Pattern recognition of conductive foil 50, fixed on heating block 64, is then performed via working hole 24 and by means of the recognition camera inside lens barrel 29. After pattern recognition, thermocompression ball bonding and ultrasonic wedge bonding of the emitter electrodes of the respective mounting parts 55 inside block 52 to conductive pattern 41B and the base electrodes to conductive pattern 41B are performed as shown in FIG. 8.

Here, as shown in FIG. 9(A), damper 60 has an opening 61 of substantially the same size as block 52 and is provided with protruding and recessed parts 63 at parts that contact conductive foil 50. By holding down the peripheral edges of block 52 by means of protruding and recessed parts 63, the rear surface of block 52 is put into close contact with heating block 64. The interior of damper 60 is provided with paths 65 and 66 for the flow of nitrogen gas.

Figure 9B:
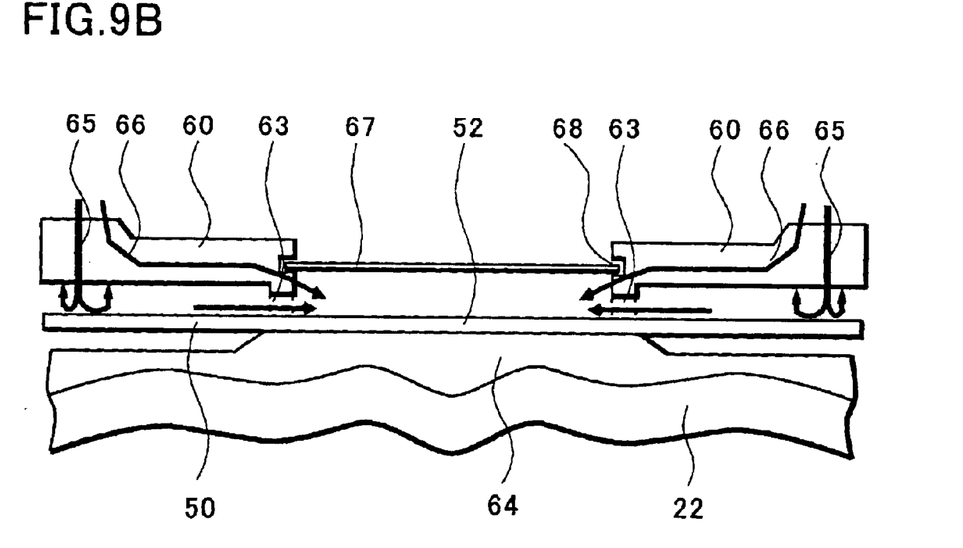

As shown in FIG. 9(B), cover 23 is formed of a damper 60 and a stainless steel plate 67. This plate 67 is fitted inside recessed parts 68 at the upper part of the damper 60 and is free to move in a direction that is horizontal with respect to the surface of damper 60 and perpendicular to the direction to the direction of movement of conductive foil 50. Working hole 24 is formed in plate 67, and pattern recognition and wire bonding are performed on block 52 by this working hole 24 moving in correspondence to the mounting parts in the row direction on copper foil 50.

Since a plurality of mounting parts 55 exist within block 52 and wire bonding is performed in a batch according to each block 52 in the present step, the duration for which block 52 is heated will be longer in comparison to that of the prior-art circuit device manufacturing method, and oxidation of block 52 may thus occur. In order to resolve this problem, damper 60 is provided as a part of cover 23 of bonding device 21, nitrogen gas is blown onto the surface of block 52 from damper 60, and, at the same time, the interior of cover 23 is filled with nitrogen gas.

Meanwhile, the interior of the cover 23 is maintained for example at 230° C. by the function of heater 30 that is built into setting base 22, and the fed-in nitrogen gas is fed in for example at a temperature of 70° C. The nitrogen gas is then heated to 230° C. inside cover 23 by heater 30. The nitrogen gas is blown into cover 23 for example at a rate of 4 liters/minute and flows out from working hole 24 upon being heated. Since the temperature of the nitrogen gas is 230° C. at this time and since the room temperature is, for example, 20° C., a shimmer 32 that flows out from working hole 24 is formed by this temperature difference. The pattern recognition precision is degraded by the outflowing shimmer 32 stagnating at the inner and outer sides of ring illumination 25 as shown in FIG. 3.

However, with bonding device 21 of this invention, shimmer prevention blow mechanism 31 is disposed at a part near working hole 24 and between ring illumination 25 and cover 23, and to be more specific, at a part immediately to the side of the lower end of ring illumination 25, and shimmer 32 can be blown away from above the working hole 24 and the surroundings of illumination ring 25 by a nitrogen gas blow 33 of, for example, 3 liters/minute. Since shimmer 32 is thus prevented from entering into the inner side of illumination ring 25, pattern recognition by the recognition camera can be performed at a high precision of the $\mu$m order and wire bonding can also be performed at high precision. As a result, a circuit device manufacturing method can be realized by which high precision wire bonding can be performed even on a small-area integrated type conductive patterns such as those of cluster block 52 wherein mounting parts are formed in 10 rows and 5 columns.

Furthermore by the resolving of the problem of the nitrogen gas for prevention of oxidation of the conductive foil 50 surface as described above, nitrogen gas can be used throughout the wire bonding process. Since the surface of conductive foil 50 will thus not become oxidized, for example, the degradation of adhesiveness with resin, due to the antioxidant film, which can accommodate temperatures up to 150° C., peeling as a result of oxidation of the conductive foil 50 surface, can be prevented. As a result, a circuit device manufacturing method can be realized by which the anti-moisture property and anti-peeling property at the surfaces of bonding of conductive foil 50 and insulating resin 40 are improved.

Figure 10A:
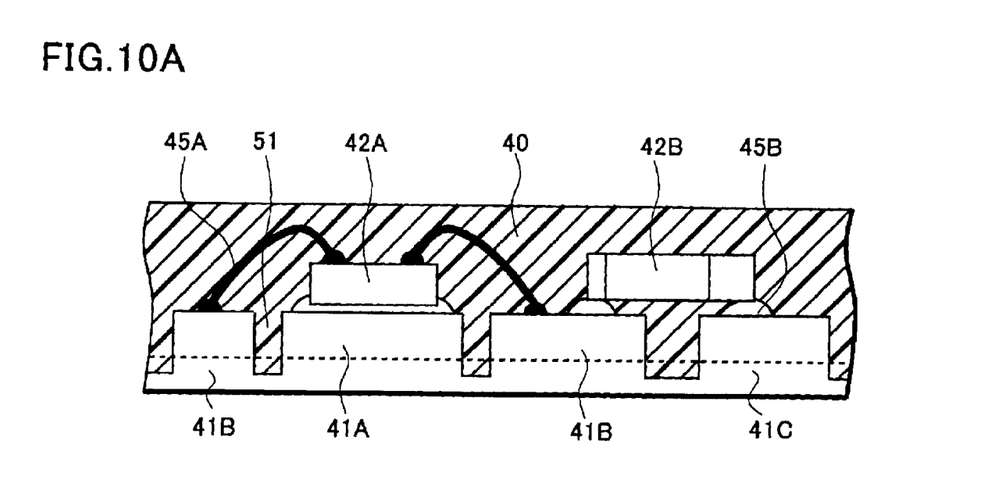
FIG. 10 is a diagram for explaining circuit device manufacturing method according to the invention.
Figure 10B:
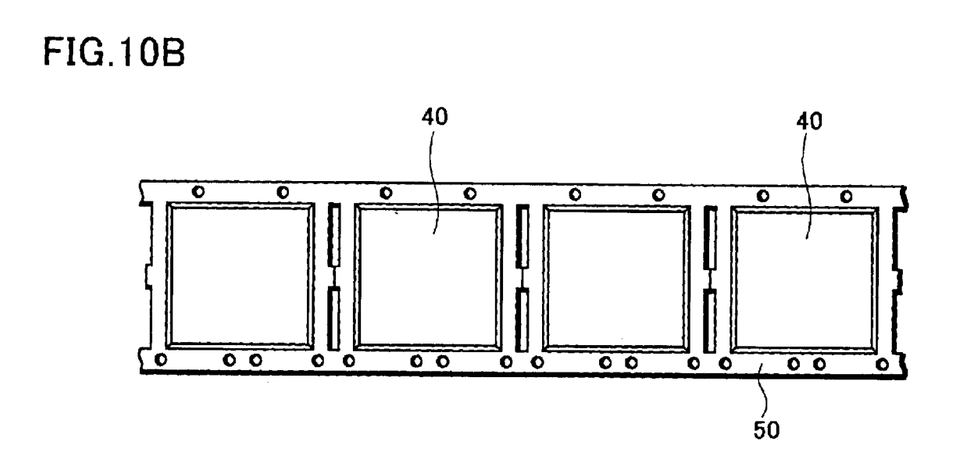

Next in the fourth step of this invention, molding in common by insulating resin 40 is performed so as to cover the circuit elements 42 of the respective mounting parts 55 in a batch and fill the isolation trenches 51 as shown in FIG. 10.

In this process, insulating resin 40 is made to cover circuit elements 42A and 42B and the plurality of conductive patterns 41A, 41B, and 41C completely and insulating resin 40 is filled in the isolation trenches 51 between conductive patterns 41 so as to fit and bind strongly with the bent structures at the side faces of conductive patterns 41A, 41B, and 41C as shown in FIG. 10(A). Conductive patterns 41 are thus supported by insulating resin 40.

This step may also be realized by transfer molding, injection molding, or potting. In terms of resin material, a thermosetting resin, such as epoxy resin, etc., may be used for transfer molding, and a thermoplastic resin, such as polyimide resin, polyphenylene sulfide, etc.; may be used for injection molding.

The thickness of insulating resin 40 that is made to cover the conductive foil 50 surface is adjusted so that uppermost part of a bonding wire 45A of a circuit element 42 will be covered by approximately 10 $\mu$m of resin. This thickness can be made thicker or thinner in consideration of strength.

A characteristic of this step is that until insulating resin 40 is coated, the conductive foil 50 that is to become conductive patterns 41 is the supporting substrate and the conductive foil 50 that is to be the supporting substrate is a material that is necessary as an electrode material. The merit that work can be performed by eliminating as much component material as possible is thus provided and cost reductions can also be realized.

Since isolation trenches 51 are formed to be shallower than the thickness of the conductive foil 50, conductive foil 50 is not separated into individual conductive patterns 41. The sheet-form conductive foil 50 can thus be handled in one piece, thus providing the characteristic that the work of conveying to a die and the work of constituting to a die in the process of molding insulating resin 40 are made extremely easy.

Figure 11:
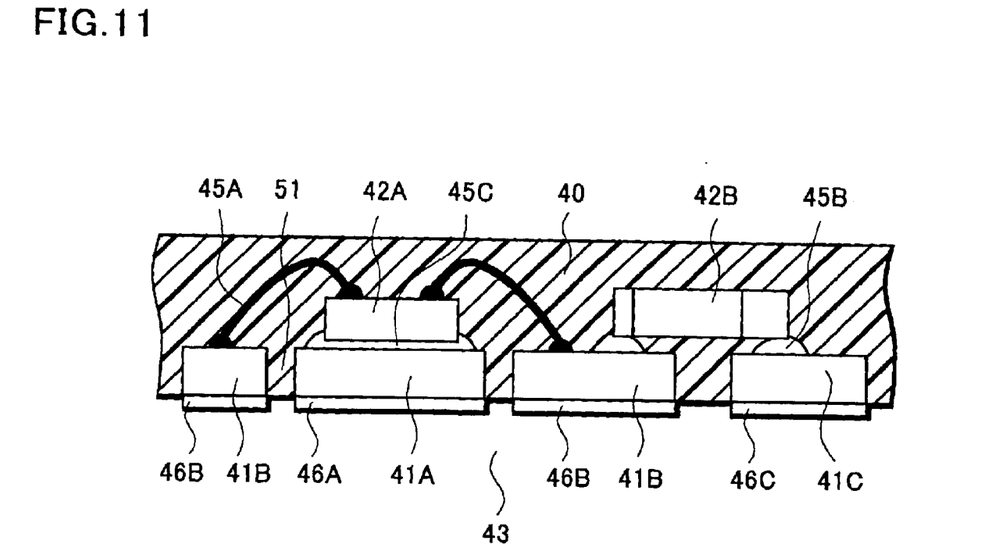
FIG. 11 is a diagram for explaining circuit device manufacturing method according to the invention.

In the fifth step of this invention, the conductive foil 50 at thick parts at which isolation trenches 51 are not provided is eliminated as shown in FIG. 11.

In this step, the rear surface of conductive foil 50 is removed chemically and/or physically to separate the respective conductive patterns 41. This step is carried out by polishing, grinding, etching, vaporization of metal by laser, etc.

In experiments, the entire surface was ground by approximately 30 $\mu$m by a polishing device or grinding device to expose insulating resin 40 via isolation trenches 51. The exposed surface is indicated by a dotted line in FIG. 10(A). As a result, conductive patterns 41 are made approximately 40 $\mu$m in thickness and separated. Also, the entire surface of conductive foil 50 may be wet etched until immediately before insulating resin 40 becomes exposed and the entire surface may then be ground by a polishing or grinding device to expose insulating resin 40. Furthermore, the entire surface of conductive foil 50 may be wet etched to the position indicated by the dotted line in order to expose insulating resin 40.

As a result, a structure is provided with which the rear faces of conductive patterns 41 are exposed on insulating resin 40. The structure is thus one with which the surface of insulating resin 40 that has been filled in isolation trenches 51 is practically matched with the surfaces of conductive patterns 41. The circuit devices 42 of this invention thus have the characteristic that they can be moved horizontally as they are by the surface tension of solder, etc., and become self-aligned in the mounting process.

Rear surface treatment of conductive patterns 41 is furthermore performed to obtain the final structure shown in FIG. 11. That is, solder or other conductive material is deposited onto the exposed conductive patterns 41 as necessary in order to complete the circuit device.

Figure 12:
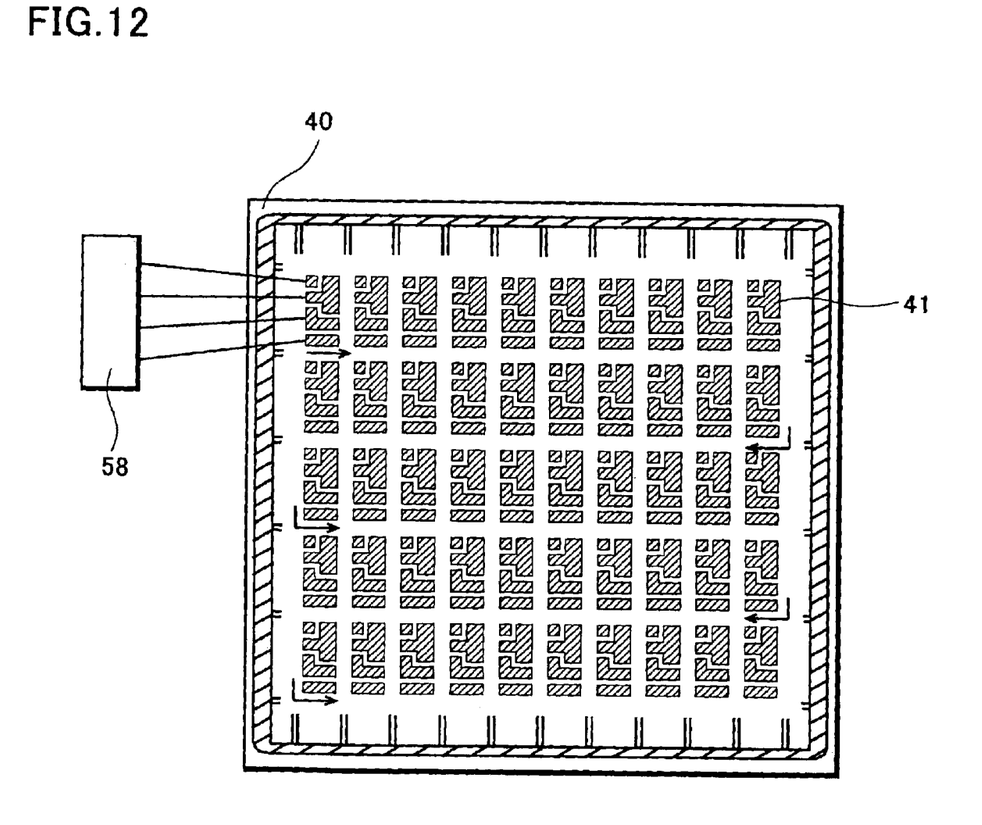
FIG. 12 is a diagram for explaining circuit device manufacturing method according to the invention.

In the sixth step of this invention, the characteristics of the circuit elements 42 of the respective mounting parts 55 that have been molded in a batch with insulating resin 40 are measured as shown in FIG. 12.

After performing rear surface etching of conductive foil 50 in the prior process, the respective blocks 52 are cut off from conductive foil 50. Since each block 52 is joined by insulating resin 40 to the remaining parts of conductive foil 50, it can be cut off by peeling from the remaining parts of conductive foil 50 mechanically and without using a cutting die.

As shown in FIG. 12, the rear surfaces of conductive patterns 41 are exposed at the rear surface of each block 52 and the respective mounting parts 55 are aligned in matrix form in exactly the same manner as they were when conductive patterns 41 were formed. By contacting rear surface electrodes 46, which are exposed from insulating resin 40 of conductive patterns 41, with a probe 58, the characteristic parameters, etc., of the circuit elements 42 of the respective mounting parts 55 are measured individually to make pass/fail judgments, and defective items are marked with magnetic ink, etc.

In this process, circuit devices 43 of the respective mounting parts 55 are held integrally according to block 52 by insulating resin 40 and are thus not separated individually. Thus by pitch feeding a block 52 placed on a setting base of a tester by just the size of a mounting part 55 in the longitudinal and horizontal directions as indicated by the arrows, the circuit devices 43 of the respective mounting parts 55 of block 52 can be measured extremely rapidly and in large amounts. That is, since the judgment between the front and rear of a circuit device, recognition of the position of electrodes, etc., which were necessary priorly, can be made unnecessary, considerable reduction of the measurement time can be achieved.

Figure 13:
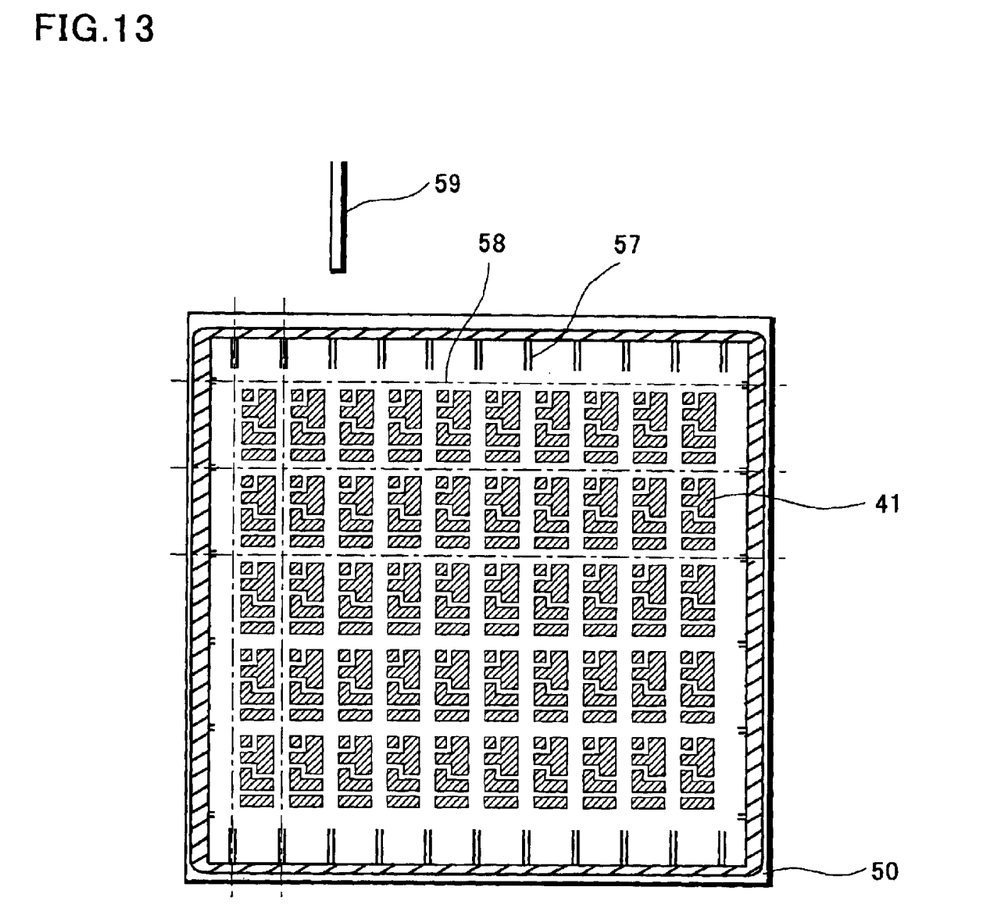
FIG. 13 is a diagram for explaining circuit device manufacturing method according to the invention.

Next in the seventh step of this invention, insulating resin 40 is separated according to each mounting part 55 by dicing as shown in FIG. 13.

In this step, block 52 is sucked by vacuum onto a setting base of a dicing device and insulating resin 40 at isolation trenches 51 is diced along dicing lines 58 between the respective mounting parts 55 by means of a dicing blade 59 to accomplish separation into the individual circuit devices 43.

In this step, dicing blade 59 is preferably operated to a cutting depth at which insulating resin 40 is substantially severed and breaking by a roller is performed after taking out block 52 from the dicing device. In the dicing process, the positioning marks 57, which were provided in advance in the above-described first step in a manner whereby they oppose each other at the inner sides of the frame-like pattern 56 that surrounds each block, are recognized and dicing is performed using these marks as reference. Though it is well known, for dicing, dicing in the longitudinal direction is performed along all dicing lines 58 and then the setting base is rotated by 90 degrees to perform dicing in the horizontal direction along dicing lines 58.

Circuit devices 43 are thus completed by the above-described manufacturing process.

Though the case where cluster blocks are formed on a conductive foil was described for this invention's circuit device manufacturing method, this invention is not necessarily limited to this case and the same effects can be obtained for substrates comprising conductive members, such as lead frames, etc. Various other modifications are also possible within a range that does not fall outside the gist of this invention.

What is claimed is:

1. A recognition device comprising:

a substrate setting base, having a heating function;

a cover, which covers a working region from above said substrate setting base;

a working hole, provided in the upper surface of said cover;

an illumination, disposed above said working hole; and a pattern recognition camera, disposed inside a lens barrel provided above said illumination; wherein fluctuation of ascending air current, which is due to an inert gas that is blown inside said cover being heated by said substrate setting base, is made to escape in the horizontal direction with respect to said cover surface by a blow current from a blowing device provided at a lower part of said illumination.

2. The recognition device according to claim 1, wherein said inert gas is made to flow into a space formed by said cover and said substrate setting base.

3. The recognition device according to claim 1, wherein a part of said cover is formed of a clamper.

4. The recognition device according to claim 3, wherein said damper is provided with a blow-in hole for said inert gas.

5. The recognition device according to claim 1, wherein said fluctuation is substantially that of said inert gas that has been heated.

6. The recognition device according to claim 1, wherein said inert gas is made of nitrogen gas.

7. The recognition device according to claim 1, wherein said illumination is a ring-shaped illumination provided below said lens barrel part.

8. A bonding device comprising:

a substrate setting base, having a heating function;

a cover, which covers a working region from above said substrate setting base;

a working hole, provided in the upper surface of said cover;

an illumination, disposed above said working hole;

a capillary, disposed at the side face of said illumination; and a pattern recognition camera, disposed inside a lens barrel provided above said illumination; wherein fluctuation of ascending air current, which is due to an inert gas that is blown inside said cover being heated by said substrate setting base, is made to escape in the horizontal direction with respect to said cover surface by a blow current from a blowing device provided below said illumination, and after recognition by said pattern recognition camera, said capillary is moved to above said working hole and bonding is performed via said working hole.

9. The bonding device according to claim 8, wherein said inert gas is made to flow into a space formed by said cover and said substrate setting base.

10. The bonding device according to claim 8, wherein a part of said cover is formed of a clamper.

11. The bonding device according to claim 10, wherein said damper is provided with a blow-in hole for said inert gas.

12. The bonding device according to claim 8, wherein said fluctuation is substantially that of said inert gas.

13. The bonding device according to claim 8, wherein said inert gas is made of nitrogen gas.

14. The bonding device according to claim 8, wherein said illumination is a ring-shaped illumination provided below said lens barrel part.

* * * * *